(12) United States Patent
Chatterjee et al.

(10) Patent No.: US 11,813,639 B2
(45) Date of Patent: Nov. 14, 2023

(54) ELECTRODE ARRANGEMENT FOR A PMUT AND PMUT TRANSDUCER ARRAY

(71) Applicant: VANGUARD INTERNATIONAL SEMICONDUCTOR SINGAPORE PTE. LTD., Singapore (SG)

(72) Inventors: Aveek Nath Chatterjee, Singapore (SG); Rakesh Kumar, Singapore (SG); Jaime Viegas, Singapore (SG); Mateusz Tomasz Madzik, Singapore (SG)

(73) Assignee: VANGUARD INTERNATIONAL SEMICONDUCTOR SINGAPORE PTE. LTD., Singapore (SG)

( * ) Notice: Subject to any disclaimer, the term of this patent is extended or adjusted under 35 U.S.C. 154(b) by 1775 days.

(21) Appl. No.: 15/278,910

(22) Filed: Sep. 28, 2016

(65) Prior Publication Data

US 2017/0320093 A1 Nov. 9, 2017

Related U.S. Application Data

(60) Provisional application No. 62/330,881, filed on May 3, 2016.

(51) Int. Cl.
*B06B 1/06* (2006.01)
*H01L 41/047* (2006.01)
*H10N 30/87* (2023.01)
*H10N 30/00* (2023.01)
(Continued)

(52) U.S. Cl.
CPC .......... *B06B 1/0629* (2013.01); *B06B 1/0238* (2013.01); *B06B 1/0622* (2013.01);
(Continued)

(58) Field of Classification Search
CPC ..... B06B 1/0622; B06B 1/06; B06B 2201/55; B06B 10/622; G10K 11/345;
(Continued)

(56) References Cited

U.S. PATENT DOCUMENTS 7,313,053 B2 12/2007 Wodnicki
9,233,396 B2 1/2016 Jeong
(Continued)

FOREIGN PATENT DOCUMENTS

CN 104271264 A 1/2015
WO 2014066006 A1 5/2014

OTHER PUBLICATIONS hinese Intellectual Property Office, Official Action received in Chinese Patent Application No. 201710305709.6 dated May 23, 2019, with English translation.
(Continued)

*Primary Examiner* — Derek J Rosenau
(74) *Attorney, Agent, or Firm* — Winston Hsu

(57) ABSTRACT

Provided in accordance with the herein described exemplary embodiments are piezo micro-machined ultrasonic transducers (pMUTs) each having a first electrode that includes a first electrode portion and a second electrode portion. The second electrode portion is separately operable from the first electrode portion. A second electrode is spaced apart from the first electrode and defines a space between the first electrode and the second electrode. A piezoelectric material is disposed in the space. Also provided are arrays of pMUTs wherein individual pMUTs have first electrode portions operably associated with array rows and second electrode portions operably associated with array columns.

12 Claims, 5 Drawing Sheets

(51) Int. Cl.
    *H10N 30/20*   (2023.01)
    *B06B 1/02*    (2006.01)
    *G10K 11/34*   (2006.01)

(52) U.S. Cl.
    CPC ....... *G10K 11/345* (2013.01); *H10N 30/1051* (2023.02); *H10N 30/2047* (2023.02); *H10N 30/87* (2023.02); *H10N 30/872* (2023.02); *B06B 2201/55* (2013.01)

(58) Field of Classification Search
    CPC .............. H01L 41/047; H01L 41/0472; H01L 41/0805; H01L 41/0973; H01L 41/042; H01L 41/825; H01L 41/04; H01L 41/08
    USPC .................................................. 310/322, 334
    See application file for complete search history.

(56) References Cited

U.S. PATENT DOCUMENTS

| | | | |
|---|---|---|---|
| 9,454,954 B2* | 9/2016 | Hajati | .................. H01L 41/098 |
| 2009/0182229 A1 | 7/2009 | Wodnicki | |
| 2010/0152587 A1 | 6/2010 | Haider et al. | |
| 2013/0162102 A1* | 6/2013 | Sammoura | ........... B06B 1/0603 |
| | | | 310/321 |
| 2013/0278111 A1 | 10/2013 | Sammoura et al. | |
| 2013/0294201 A1 | 11/2013 | Hajati | |
| 2014/0117812 A1 | 5/2014 | Hajati | |
| 2014/0232241 A1 | 8/2014 | Hajati | |
| 2015/0169136 A1 | 6/2015 | Ganti et al. | |
| 2017/0246662 A1* | 8/2017 | Kidwell, Jr. | .......... B06B 1/0603 |

OTHER PUBLICATIONS

Chu et al., High Voltage Pulser Circuits, Supertex Inc. , 2009, pp. 1-6, AN-H53 Application Note.
Chirp-Scale Arrays Enable 3D Ranging, Chirp Microsystmes, p. 20.
Akasheh et al., "Development of piezoelectric micromachined ultrasonic transducers"., Sensors and Actuators A-PHysical, Mar. 15, 2004, pp. 275-287, vol. 111.
Taiwan Intellectual Property Office, Rejection Decision for Taiwanese Patent Application No. 105138233, dated Oct. 26, 2018.

* cited by examiner

ELECTRODE ARRANGEMENT FOR A PMUT AND PMUT TRANSDUCER ARRAY

CROSS-REFERENCE TO RELATED APPLICATION

This patent claims priority to U.S. Provisional Patent Application Ser. No. 62/330,881 entitled "Method and System for Denser Ultrasonic Transducer Arrays using Limited Set of Electrical Contacts," filed May 3, 2016.

TECHNICAL FIELD

This patent relates to piezo micro-machined ultrasonic transducers (pMUTs), and in particular, to electrode arrangements for pMUTs and transducer arrays including pMUTs.

BACKGROUND

Micro-machined ultrasonic transducers (MUTs) continue to develop as technological elements for machine-human interface and healthcare applications. Recent advances in micro-fabrication technology and techniques have resulted in wider and innovative applications for pMUTs as limitations such as critical dimensions have been resolved to an appreciable stage. Unlike capacitive micro-machined ultrasonic transducers (cMUTs), pMUTs do not require high DC polarization voltages and small capacitive gaps, which reduces complexity of driving circuitry and fabrication.

Arrays of pMUTs find use in a variety of sensing applications. For example, an array with a contact area of approximately 5 millimeters (mm) by 5 mm using approximately 100 transducers by 100 transducers, is usable as a 500 dots per inch (dpi) (pitch 50 micrometer (μm)) fingerprint sensor.

In a pMUT array, each transducer acts as a pixel, and each transducer is used as both a driver and a sensor. An array of N transducer elements, therefore, requires $N^2$ transducer connections. Thus, even a modestly sized array requires a significant number of transducer connections.

Typical pMUT arrays have few elements (fewer than 100 vibrating membranes) and as such, connecting each membrane to the corresponding driving circuitry is achieved with wire-bonding, flip-chip bonding or any other one-to-one correspondence of each membrane electrode pair to driving electronics. For integration of a large number of pMUTs for advanced, high resolution ultrasonic imaging, the number of required connections can be too complex and cumbersome for direct implementation. In these applications each pMUT in the array will typically have its own top electrode, and these are typically connected in parallel as single rows or columns.

Therefore, it is desirable to provide a pMUT that is reliably, individually addressed. Additionally, it is desirable to reduce the number of transducer connections required within a pMUT array while maintaining the fidelity of the array. Reconfiguration of the electrode arrangements of a pMUT transducer that may be used in such an array may lead to a reduced number of transducer connections. Moreover, arrays of pMUT transducers having reconfigured electrode arrangements may have reduced connection requirements. Reconfiguring the electrode arrangements of pMUTs may furthermore facilitate operation of the array by row/column addressing of array elements with a minimum number of electrical contacts. Furthermore, other desirable features and characteristics will become apparent from the subsequent detailed description and the appended claims, taken in conjunction with the accompanying drawings and this background.

BRIEF SUMMARY

Provided in accordance with the herein described exemplary embodiments are piezo micro-machined ultrasonic transducers (pMUTs) each having a first electrode that includes a first electrode portion and a second electrode portion. The second electrode portion is separately operable from the first electrode portion. A second electrode is spaced apart from the first electrode and defines a space between the first electrode and the second electrode. A piezoelectric material is disposed in the space.

Further provided in accordance with herein described embodiments are arrays including a plurality of pMUTs. Each pMUT in an array has a first electrode having a first electrode portion and a second electrode portion. The second electrode portion is separately operable from the first electrode portion. A second electrode is spaced apart from the first electrode to define a space between the first electrode and the second electrode. A piezoelectric material is disposed in the space. The first electrode portion of each pMUT is coupled to a first electrical connection, and the second electrode portions of each pMUT is coupled to a second electrical connection, different than the first electrical connection. The second electrode is coupled to reference.

In accordance with further herein described embodiments, there is provided an ultrasonic sensing device. The device includes an array of piezo micro-machined ultrasonic transducers (pMUTs), wherein each pMUT in the array has a first electrode having a first electrode portion and a second electrode portion that is separately operable from the first electrode portion. A second electrode is spaced apart from the first electrode to define a space between the first electrode and the second electrode. A piezoelectric material is disposed in the space. An integrated circuit is coupled to the array. The first electrode portion of each pMUT is coupled to a first electrical connection of the integrated circuit. The second electrode portions of each pMUT are respectively coupled to a second electrical connection of the integrated circuit that is different than the first electrical connection. The second electrode is coupled to reference of the integrated circuit.

BRIEF DESCRIPTION OF THE DRAWINGS

A more complete appreciation of the exemplary embodiments and many of the attendant advantages thereof will be readily obtained as the same becomes better understood by reference to the following detailed description when considered in connection with the accompanying drawings, wherein.

DETAILED DESCRIPTION

Figure 1:
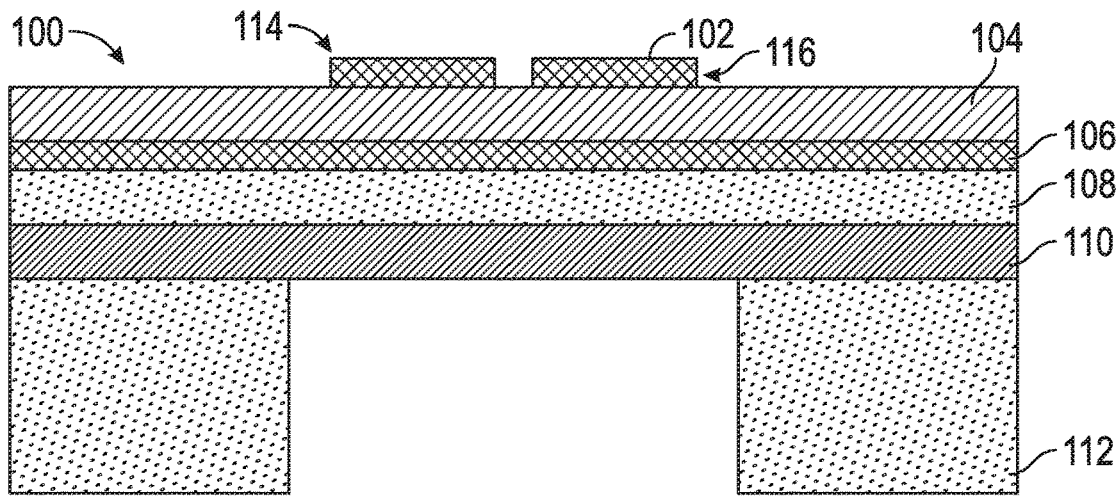
FIG. 1 is a cross-sectional schematic of a piezo micro-machined ultrasonic transducer (pMUT) that may be configured in accordance with one or more of the herein described embodiments.

The following detailed description is merely exemplary in nature and is not intended to limit the various embodiments or the application and uses thereof. Furthermore, there is no intention to be bound by any theory presented in the preceding background or the following detailed description. Embodiments described in the present disclosure are generally directed to piezo micro-machined ultrasonic transducers (pMUT), and methods for configuring and operating the same. The various structures, elements, tasks and steps described herein may be incorporated into a more comprehensive structure, procedure or process having additional elements, steps or functionality not described in detail herein. In particular, many structures, designs and methods of producing pMUTs, pMUT arrays and circuits and sensors incorporating pMUTs are well-known and so, in the interest of brevity, many conventional aspects of such devices and assemblies will only be mentioned briefly herein or will be omitted entirely without providing the well-known details.

For the sake of brevity, conventional components and techniques and other functional aspects of the devices, systems and the individual operating components of a system may not be described in detail herein. Furthermore, the connecting lines shown in the various figures contained herein are intended to represent examples of functional relationships and/or physical couplings between the various elements. It should be noted that many alternative or additional functional relationships or physical connections may be present in the various embodiments. Finally, like reference numerals are used to identify like elements of the various embodiments throughout the application.

Typically, pMUT arrays have few elements (fewer than 100 pMUTs and associated piezoelectric layers or membranes) and as such, connecting each pMUT to the corresponding driving circuitry is achieved with wire-bonding, flip-chip bonding or any other one-to-one correspondence of the electrode pair of each pMUT to driving electronics. For integration of a large number of pMUTs for advanced, high resolution ultrasonic imaging, the number of required connections can be too complex and cumbersome for direct implementation. In those cases, a row/column scheme of addressing each acoustic pixel is more feasible and less complex. Reducing the number of connections required for a pMUT array allows use of conventional connecting technologies.

For the pMUTs in accordance with the herein described embodiments, and arrays incorporating such pMUTs, it may be convenient not to pattern the second or bottom electrode of the pMUT, as it may interfere with the crystalline quality of the thin film piezoelectric layer, which in turn may affect the piezoelectric coefficients of the piezoelectric layer. Such a configuration requires a unique configuration of the first or top electrode to facilitate row/column addressing within a dense pMUT array.

In accordance with a herein described embodiment, therefore, a piezo micro-machined ultrasonic transducer (pMUT) is designed to have a top electrode metallization layer (or layers) to facilitate row/column addressing using only the top electrode. This arrangement permits the pMUT to be arranged in complex arrays and to use column and row based electrical signal driving. The pMUT is capable of generating and detecting acoustic waves via a piezoelectric deformable layer between the first and second electrodes embracing the structural thin film or films forming a suspended piezoelectric layer or membrane. The top electrode portions are used to operably transmit the ultrasonic wave via dynamic excitation of the piezoelectric layer by an electrical signal. As will be described, each individual pMUT of the array is addressable through phase shifted signals respectively applied to the top electrode portions. The piezoelectric layer can be clamped or otherwise operably disposed between the electrodes for excitation by application of electric signals to the top electrode portions, and it may be circular, rectangular, square, or any other two-dimensional shape.

FIG. 1 demonstrates a cross-sectional schematic of a typical pMUT 100. In the cross-sectional view, a first or top electrode 102 is situated at the top of the pMUT 100, and it may be placed directly on top of a piezoelectric layer 104, which separates the top electrode 102 and a second or bottom electrode 106. It is noted that designations such as top, bottom, above, below and the like are used throughout to describe orientation of structures as depicted in the drawings, and should not be taken to indicate a required position or orientation of structures in actual implementations of devices in accordance with the herein described embodiments. Below the second electrode 106 is a structural layer 108, the thickness of the layer 108 allows for adjustment of the tuning frequency of the piezoelectric layer 104 and hence the operation of the pMUT, through conventional piezoelectric design principles. Beneath the layer 108 is an isolation dielectric 110 and a support structure made of, e.g., silicon 112.

The piezoelectric layer 104 is formed as a thin layer or membrane, which is fabricated using known techniques of microfabrication from a suitable material, such as aluminum nitride (AlN), although other conventional piezoelectric materials may be used. As such, the suspended piezoelectric layer 104 can mechanically deform and oscillate if a time-varying electrical signal is applied to the first and second electrodes 102 and 106. Reciprocally, if an oscillating mechanical force, such as an acoustic pressure, is applied to the layer 104, it will vibrate and in turn produce a time-varying electrical signal that will be detected at the electrodes 102 and 106.

In accordance with various ones of the herein described embodiments, pMUT devices 100 have a patterned first or top electrode 102 while the second or bottom electrode 106 is not patterned. Specifically, second electrode patterning may be detrimental to device performance and affect the quality of the piezoelectric layer 104. As such the second electrode 106 may form a continuous bottom surface of a microchip forming a pMUT array and may be electrically grounded for reduction of the cross-talk between different elements of the array. For example, the second electrode 106 may exist as-deposited without subsequent material removal. Furthermore, forming the second electrode 106 as a continuous layer improves crystalline quality while reducing defect density, especially in the piezoelectric layer 104. The first and second electrodes 102 and 106 may be made of electrical conductive materials, typically but not limited to metals. Examples of such metals are molybdenum, aluminum, nickel, platinum, titanium, cobalt, tungsten, and similar metals.

With continued reference to FIG. 1 and with reference also to the various embodiments depicted in FIGS. 2-6, a piezo micro-machined ultrasonic transducer (pMUT) 100 includes the first electrode 102 and the second electrode 106 (not depicted in FIGS. 2-6). The second electrode 106 is spaced apart from the first electrode 102 defining a space between the first electrode 102 and the second electrode 106 within which is disposed the piezoelectric layer 104. The first electrode 102 further has a first electrode portion 114 and a second electrode portion 116. The first electrode portion 114 and the second electrode portion 116 are separately operable, i.e., addressable either to generate a signal or to sense a signal.

With continued reference to FIGS. 2-6, in accordance with the various herein described embodiments, the first electrode 102 is patterned and includes at least the first electrode portion 114 and the second electrode portion 116. The first electrode portion 114 is operably coupled to be driven by a first (row/column) electrical signal via a first electrical connection 118. The second electrode portion 116 is operably coupled to be driven by a second (row/column) electrical signal via a second electrical connection 120. The first and second electrical connections 118 and 120 operably couple to a driving circuit element 122. The driving circuit 122 is shown in FIGS. 2-6 as a separate functional element, and it may be any suitable pulser-type driving electronics and associated sensing electronics. The driving circuit 122 may furthermore be coupled to receive signals from and to communicate signals to additional processing circuitry as is conventional. The driving circuit 122 while shown as a separate functional element, may be formed structurally as an integrated structure with the pMUTs or pMUT array.

Figure 2:
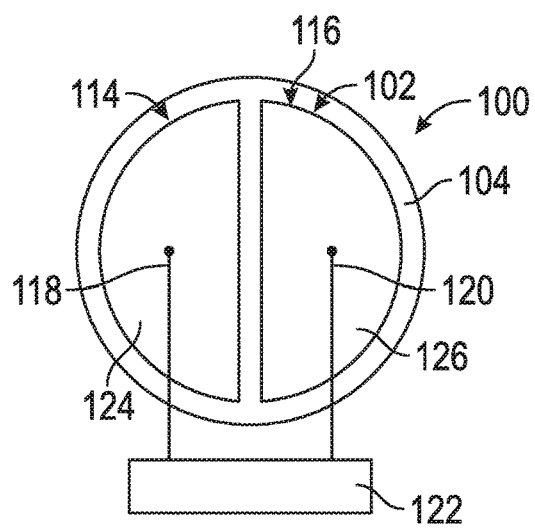
FIG. 2 is a top view schematic of an electrode arrangement for a pMUT in accordance with a herein described embodiment.

In the embodiment of the pMUT 100 depicted in FIG. 2, the first electrode 102 is circular. The first electrode 102 may have other shapes, including oval, square, rectangular and the like. With the first electrode 102 being circular, the first electrode portion 114 is a first semi-circular portion 124 of the electrode 102, and the second electrode portion 116 is a second semi-circular portion 126 of the electrode 102.

Figure 3:
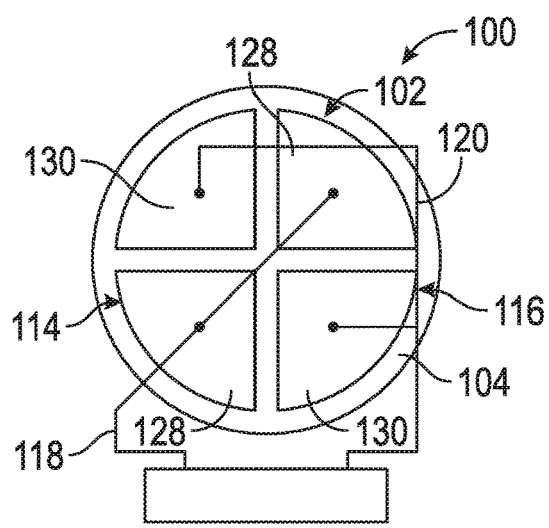
FIG. 3 is a top view schematic of an electrode arrangement for a pMUT in accordance with a herein described embodiment.

In the embodiment of the pMUT 100 depicted in FIG. 3, the first electrode 102 is circular. The first electrode portion 114 includes first semi-circular portions 128 of the electrode and the second electrode portion 116 includes second semi-circular portions 130 of the electrode.

Figure 4:
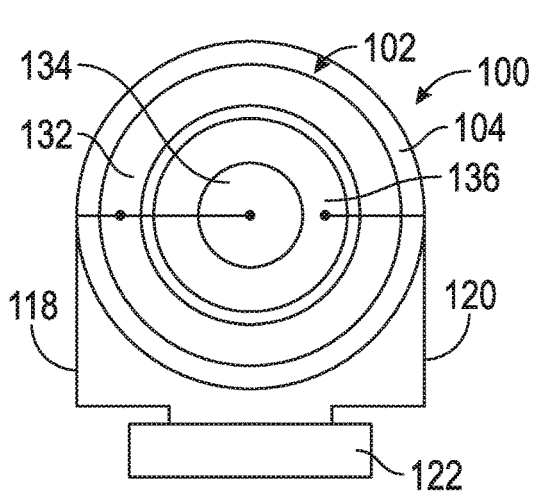
FIG. 4 is a top view schematic of an electrode arrangement for a pMUT in accordance with a herein described embodiment.

In the embodiment of the pMUT 100 depicted in FIG. 4, the first electrode 102 is circular. The first electrode portion 114 is an annular portion 132 and circular portion 134 and the second electrode portion 116 is annular portion 136 concentric with the annular portion 132 and circular portion 134.

Figure 5:
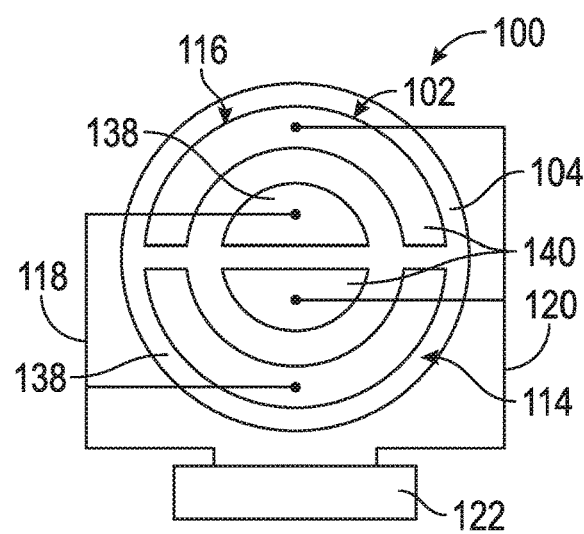
FIG. 5 is a top view schematic of an electrode arrangement for a pMUT in accordance with a herein described embodiment.

In the embodiment of the pMUT 100 depicted in FIG. 5, the first electrode 102 is circular. The first electrode portion 114 includes first semi-circular portions 138 of the electrode 102 and first semi-annular portions 138 of the electrode 102. The second electrode portion 116 includes second semi-circular portion 140 and second semi-annular portions 140 of the electrode 102.

Figure 6:
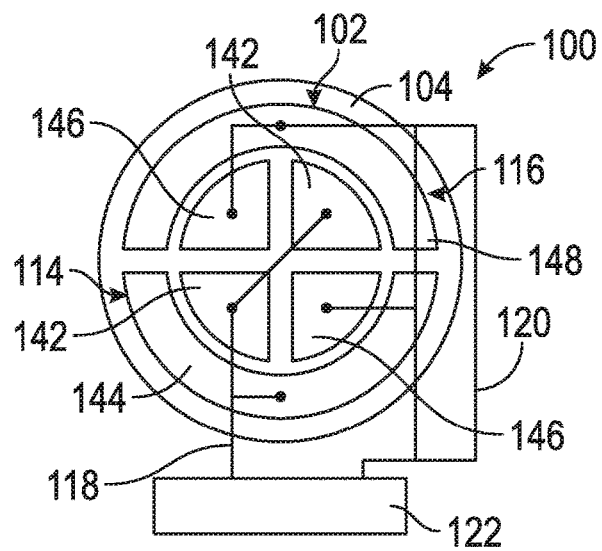
FIG. 6 is a top view schematic of an electrode arrangement for a pMUT in accordance with a herein described embodiment.

In the embodiment of the pMUT 100 depicted in FIG. 6, the first electrode 102 is circular. The first electrode portion 114 includes first semi-circular portions 142 of the electrode 102 and a first semi-annular portion 144 of the electrode 102. The second electrode portion 116 is a second semi-circular portion 146 and a second semi-annular portion 148 of the electrode.

While the first electrode 102 in each of the embodiments depicted in FIGS. 2-6 is circular, and the first electrode portions 114 and the second electrode portions 116 are semi-circular or semi-annular, the first electrode 102 may be square or rectangular, for example, and the first electrode portions 114 and the second portions 116 may be square or rectangular. The first electrode 102 may have virtually any other suitable shape with the first electrode portions 114 and the second electrode portions 116 having suitably configured geometric shapes. Also, it will be appreciated that various combinations of shapes, such as but not limited to those shown in FIGS. 2-6 and otherwise described herein, may be employed to form the first electrode portions 114 and the second electrode portions 116.

In accordance with the herein described embodiments, the first electrode portion 114 and the second electrode portion 116 may be excited or sensed separately, i.e., they are separately operable to correspondingly transmit an ultrasonic wave and to receive a reflected portion of the ultrasonic wave. In array configurations, each first electrode portion 114 may be row or column addressable while the second electrode portions 116 may be correspondingly row or column addressable.

With the herein described configurations of pMUTs 100 having a patterned first or top electrode 102 and an unpatterned second or bottom electrode 106 configuration, in operation a fundamental mode (also known as first mode) is obtained with a sinusoidal AC voltage/current driving source having a frequency corresponding to the first mode of the piezo layer 104, and the AC driving source being applied to the first electrode portions 114 and the second electrode portions 116 with a phase difference of 0 (zero) degrees. With the AC driving source being applied to only one of the first electrode portion 114 or the second electrode portion 116, the dynamic displacement will be half of the first mode obtained from driving the first electrode portion 114 and the second electrode portion 116 in phase. If the first electrode portion 114 and the second electrode portion 116 are driven by the AC driving source at a frequency corresponding to the first mode of the piezo layer 104, but out of phase by 180 degrees, i.e., phase difference of 180 degrees, the vibration of the layer 104 is heavily damped, with no displacement measurable. Therefore, the mechanical oscillation of the layer 104 is shut down even with the AC driving source being applied to both first electrode portion 114 and the second electrode portion 116.

By using electric bipolar signals, the first and second electrode portions may be set at the same driving polarity, turning on the pMUT by inducing vibration in the piezo layer 104. The first and second electrode portions may be driven at opposite polarities, i.e., 180° phase shift of equal level signals, turning off the vibration of the pMUT piezo layer 104. Further, by using the opposite polarity mode and a driving frequency corresponding to the resonance of the higher mode of the membrane that matches the vibration pattern of the out-of-phase dual electrode configuration, the operation frequency of the pMUT is changeable. This ability facilitates advanced beam forming patterns within two-dimensional pMUT arrays.

For fabrication, aluminum nitride (AlN) may be used as the active piezoelectric layer 104 with a thickness of approximately 1 µm to approximately 4 µm, positioned between the top and bottom electrodes 102 and 106, which may be 0.2 μm thick molybdenum deposited over an approximately 3 μm to approximately 10 μm silicon passive membrane layer 108. In alternative embodiments, materials such as lead zirconate titanate (PZT), zinc oxide (ZnO), and materials of similar physical properties may be used for the piezo layer 104. Of course other suitable piezoelectric materials may be used to form the layer 104, and other suitable metals may be used for top and bottom electrodes 102 and 106. The electrode 102 may have an area of approximately 60% to approximately 70% of the piezo layer 104 area that is then patterned into the first electrode portion 114 and second electrode portion 116, for example, into two semi-circular portions 124 and 126, with each connected to a different electrical connecting pad, 118 and 120. The bottom electrode 106 is not patterned to correspond to the top electrode 102 portions 114 and 116, or otherwise, and covers substantially the entire bottom side of the layer 104.

Figure 7:
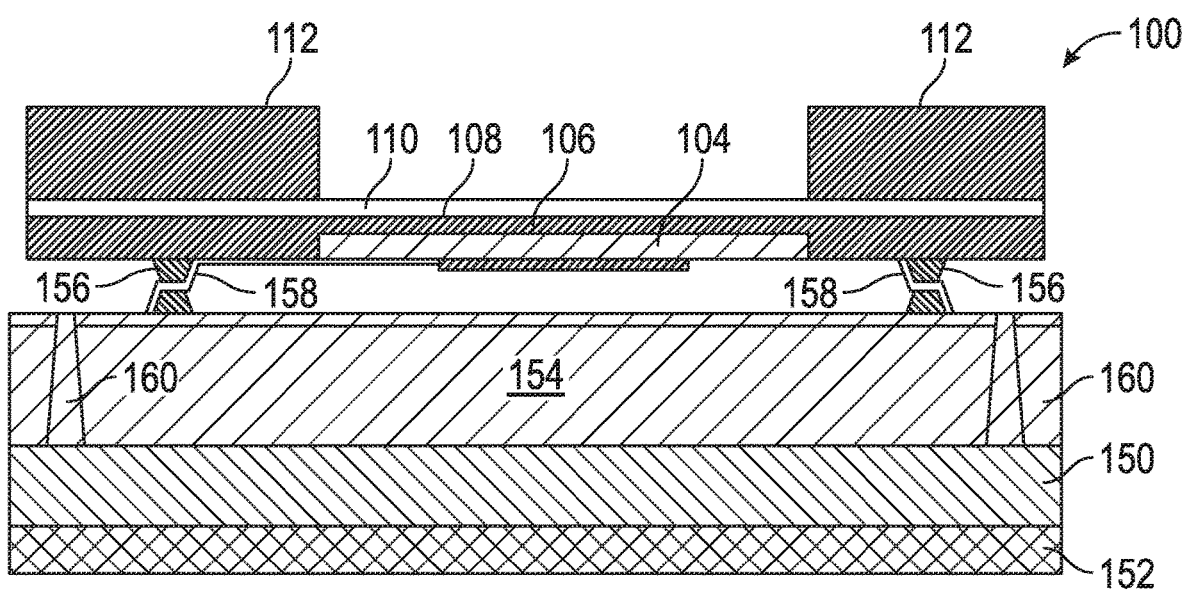
FIG. 7 is a cross-sectional schematic of a piezo micro-machined ultrasonic transducer (pMUT) and associated control circuit that may be configured in accordance with one or more of the herein described embodiments.

As depicted in the FIG. 7 cross-sectional schematic, the pMUT 100 may be coupled with a complementary metal-oxide semiconductor (CMOS) based driver and signal processing application specific integrated circuit (ASIC) 150 including a CMOS layer 152 and a through-silicon via (TSV) layer 154. The TSV layer 154 electrically isolates the CMOS layer 152 and the pMUT 100, with TSV layer 154 providing a channel of vertical electrical connection 158. Stand-offs 156 isolate the layer 104 from the TSV layer 154. The thickness of the stand-offs 156 may be 1 to 3 um. The thickness of the TSV layer may be 100 to 250 um. The aspect ratio of the vias 160 may be 20 to 30. In this embodiment, the thickness of the layer 104 may be 1 to 4 um.

The ASIC 150 may be a 180 nm bipolar-CMOS-DMOS (BCD) technology, which can be operatively configured to drive the pMUT 100 and to process electronic signals from the pMUT 100. The driving circuit may contain a high voltage pulser, as are known, that can boost 3.3 to 5 Volts (from CMOS input) to 10-60 Volts. The ASIC 150 may further include time gain compensation and low noise amplification to provide a gain of 20 to 40 decibel (dB).

A method of forming a piezo micro-machined ultrasonic transducer (pMUT) 100 in accordance with herein described embodiments may therefore include providing a starting wafer. The starting wafer may be a silicon on insulator (SOI) type wafer as is well known. A layer 104 of piezoelectric material may be formed on the starting wafer, and then the first electrode 102 and the second electrode 106 are formed on the layer 104. The first electrode 102 may then be patterned to form the first electrode portion 114 and second electrode portion 116. It will be appreciated that virtually any form of additive, subtractive, deposition, etching or other techniques for the manufacture of micro-machined devices, as are well known, may be employed. Furthermore, it will be appreciated that the order of the formation process described herein may be altered or conformed in accordance with the various manufacturing processes employed.

Patterning the first electrode 102 into at least first and second electrode portions provides the various configurations of first and second electrode portions, 114 and 116, respectively, herein described and as will be appreciated by the skilled person.

Figure 8:
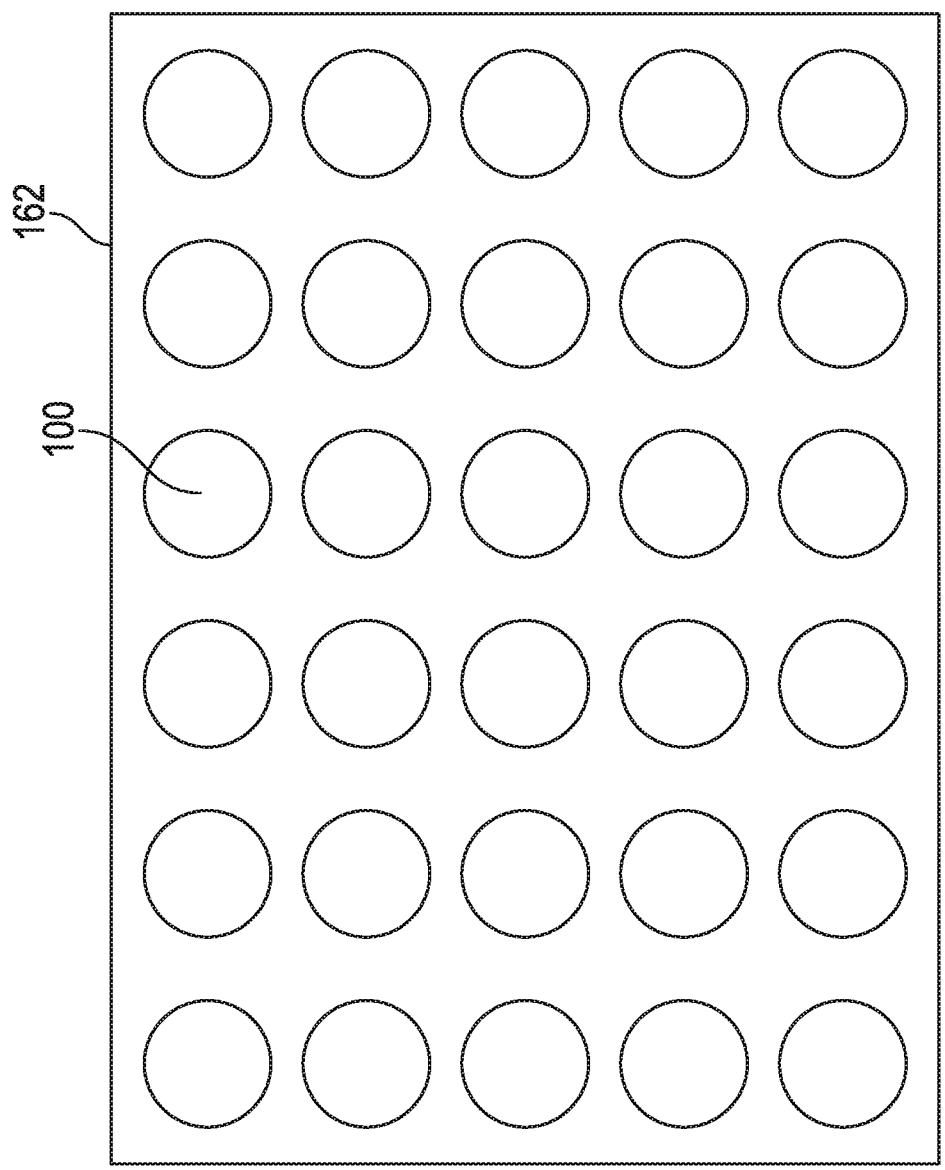
FIG. 8 is a schematic illustration of an array of pMUTs in accordance with herein described embodiments.

The pMUT 100, and the ability to row/column address each pMUT via the unique patterned top electrode 102 structure, offers the possibility to configure dense N×N pMUT arrays. FIG. 8 is a graphic depicting an array 162 including a plurality of pMUTs 100. The electrical connections of the pMUTs 100 within the array 162 are omitted from the graphic of FIG. 8 for clarity.

Figure 9:
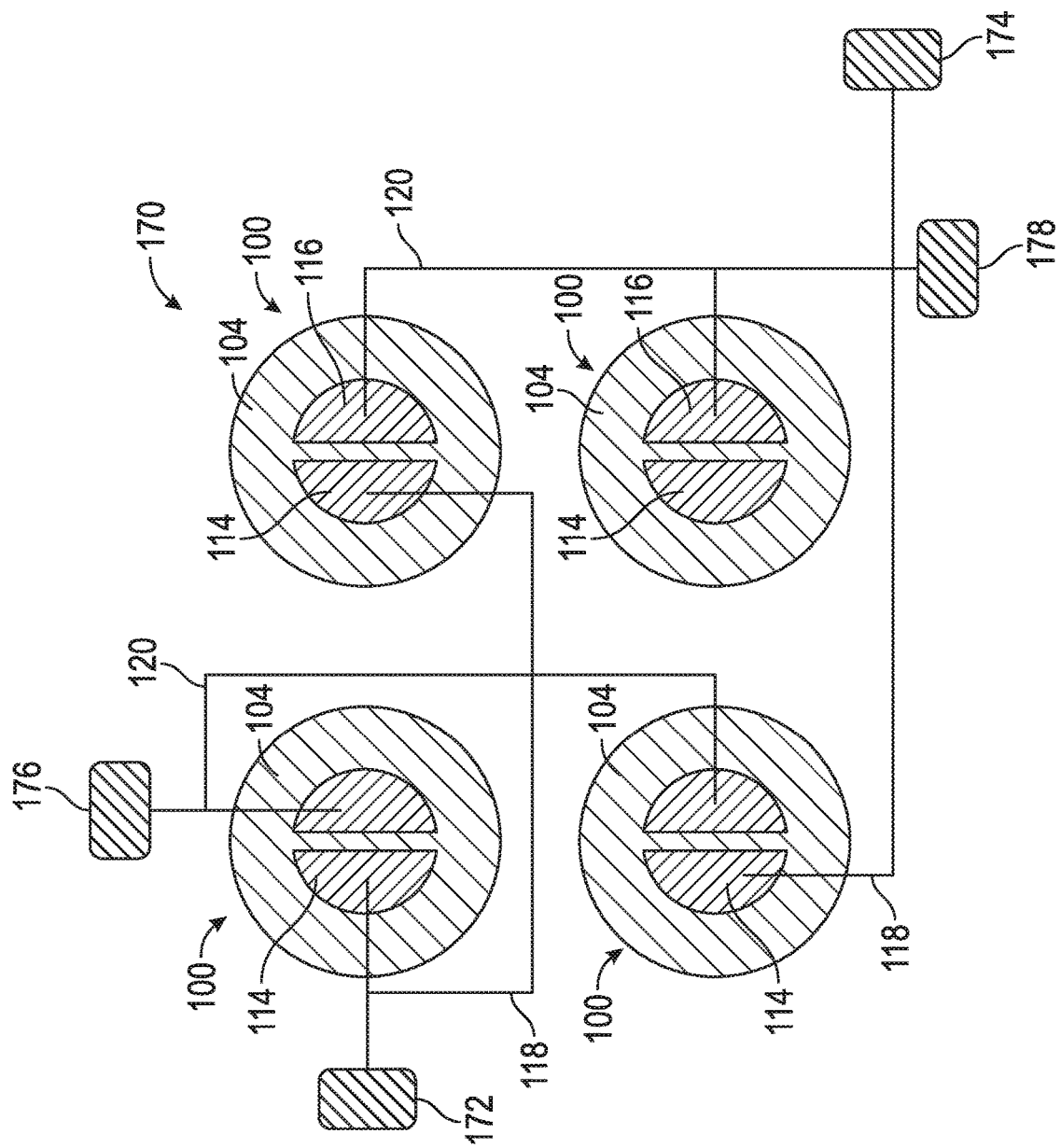
FIG. 9 is a schematic illustration of an array of pMUTs in accordance with herein described embodiments.

For illustration and discussion purposes, FIG. 9 depicts a two-by-two (2×2) pMUT array 170 including four (4) pMUTs 100. The pMUTs 100 are arranged into rows 172 and 174 and columns 176 and 178. Electrical connections 118 electrically couple the first electrode portions 114 of a first plurality of pMUTs 100 within the array 170 to form a first row 172. Electrical connections 118 electrically couple the first electrode portions 114 of a second plurality of pMUTs 100 within the array 170 to form a second row 174. In corresponding manner, electrical connections 120 electrically couple the second electrode portions 116 of the first plurality of pMUTs 100 within the array 170 to form a first column 176, while electrical connections 120 electrically couple the second electrode portions 116 of the second plurality of pMUTs 100 within the array 170 to form a second column 178. Each of the rows 172 and 174 and the columns 176 and 178 are coupled to electronic circuitry (not depicted in FIG. 9) to effect operation of the array 170.

Figure 10:
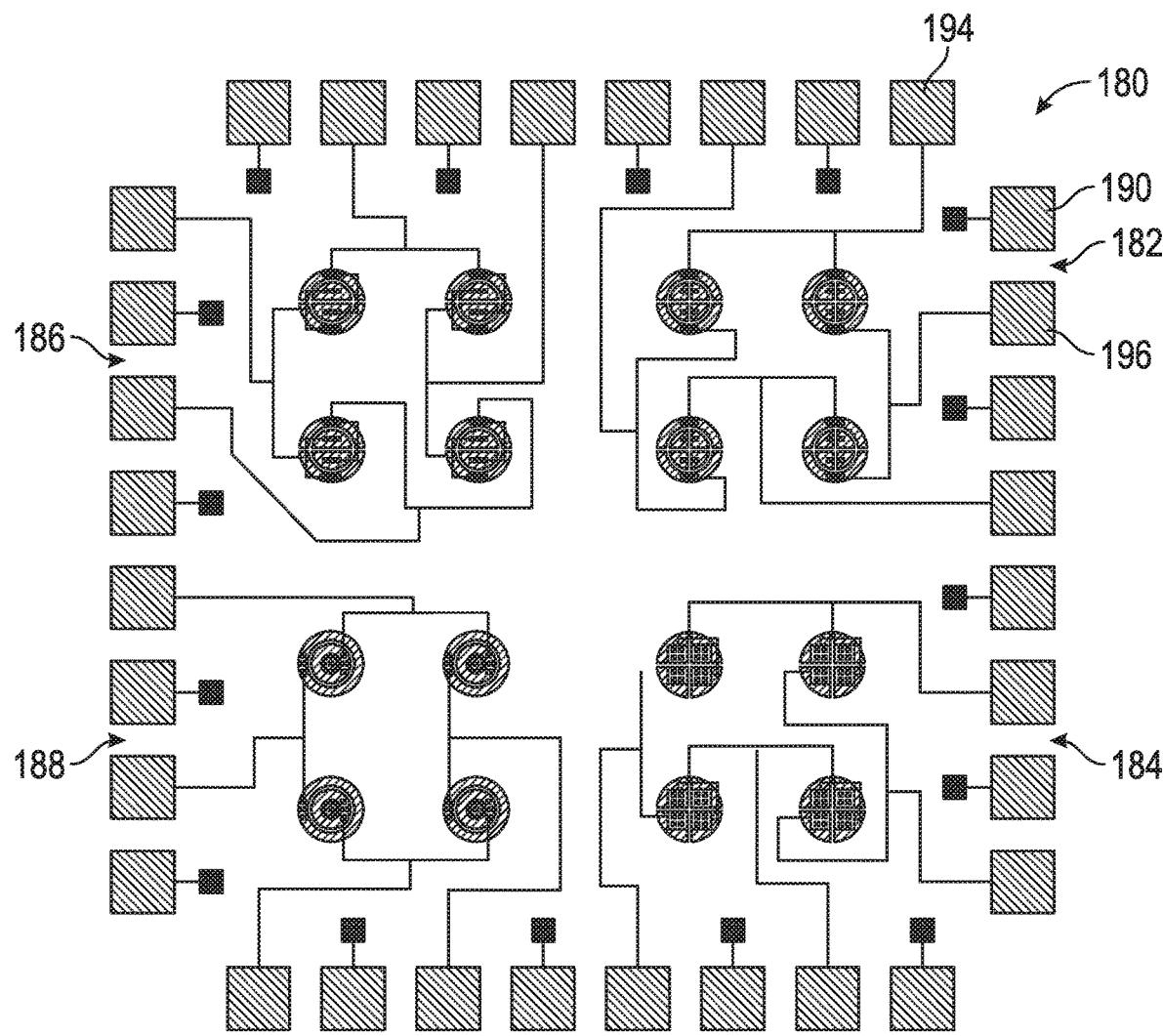
FIG. 10 is a schematic illustration of an array of pMUTs in accordance with herein described embodiments.

FIG. 10 illustrates an eight-by-eight (8×8) array 180 of pMUTs 100 wherein within the array are array portions 182, 184, 186 and 188. Each array portion is configured as a four-by-four (4×4) array configured in a manner similar to array 170 depicted in FIG. 9. Each array portion 182, 184, 186 and 188 may have pMUTs 100 of different configurations, such as but not limited to, the various configurations of pMUTs depicted in FIGS. 2-6. This allows tuning of portions of the array 180 with array portions having a desired response characteristic. Alternatively, all of the array portions may be configured the same. In all cases, the number of required connections to achieve row and column addressing of pMUTs within the array 180 and the array portions is significantly reduced.

FIGS. 9 and 10 illustrate complex arrays (170 and 180) formed by connecting different drive lines for row and column selection, using at least two top electrode portions (one for row selection and another for column selection) with a bottom electrode configured as a reference, for example, ground.

The electronic pulse controller changes the pulse polarity from, for example, 4 volts (V) representing a logic 1 to −4V representing a logic 1. When both top electrode portions 114 and 116 are pulsed with the same polarity, the piezo layer 104 vibrates at the resonant frequency of the layer 104 (selected as carrier frequency of the pulse modulated signal). The piezo layer 104 vibration is off when the two electrode portions 114 and 116 are driven by pulses with opposite polarity.

Interferogram analysis performed demonstrates the states of behavior of the pMUT 100. For example, with the top electrodes driven by an in-phase 4 Vpp AC signal scanning from 1.975 MHz to 1.997 MHz, with the fundamental mode resonance at 1.99 MHz, corresponding resonant vibration is induced in the layer 104. When switching one of the electrode portions 114 or 116 to an inverted signal polarity (180° phase shift) no displacement is observable.

Within arrays in accordance with the herein described embodiments, N×N arrays of pMUTs 100 may be electrically connected using only 2N are needed as opposed to $N^2$ traditionally required. Another benefit of this design is a high contrast on-off ratio without floating grounds/signals inducing residual piezoelectric to mechanical transduction.

In accordance with additional embodiments of the invention, an array of pMUT devices may be operated as a sensing device, and in particular, an ultrasonic sensing device.

Therefore, in accordance with herein described embodiments, a method of controlling pMUTs, such as pMUT 100, and arrays including pMUT devices, such as but not limited to arrays configured as array 100, 170 and 180, may include applying a first AC driving signal of a first phase to each of the first electrode portions and the second electrode portions to achieve a first dynamic displacement of the piezoelectric layer. A second AC driving signal of a second phase, different than the first phase, may be applied to one of the first electrode portions and the second electrode portions to dampen the dynamic displacement of the piezoelectric layer.

The first phase and the second phase may be 180 degrees out of phase to ensure sufficient dampening of the dynamic displacement of the layer. While the AC driving signal may be of any virtually any configuration, one suitable configuration is sinusoidal with a frequency corresponding to a first mode of the piezoelectric layer. Additionally, a reduced dynamic displacement of the layer may be obtained by applying the AC driving signal to only one or the other of the first electrode portions and the second electrode portions.

In an embodiment to provide row/column addressing of the pMUTs, the first electrode portions are associated by operable electrical connections into rows of the array and the second electrode portions are associated by operable electrical connections into columns of the array. A pMUT within the array may be identified from the plurality of pMUTs within the array based upon a row of the first electrode portion and a column of the second electrode portion. In this regard, individual pMUTs may be caused to generate a dynamic displacement, or addressed to sense a response.

Further capability of an array of pMUTs as herein described may be obtained by associating a first group of pMUTs of a plurality of pMUTs into a first array portion and associating a second group of pMUTs of a plurality of pMUTs, different than the first group of pMUTs, into a second array portion. In an array configured in this manner, the different array portions may be tuned to provide particular dynamic response, sensing capability and other functionality. Moreover, a beam formed response from the array may be achieved by applying an AC driving signal to the first electrode portions and the second electrode portions of selected ones of the plurality of the pMUTs, less than the entire plurality of the pMUTs within the array.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

The invention claimed is:

1. A piezoelectric micro-machined ultrasonic transducer (pMUT) comprising:
  a first electrode having a first electrode portion and a second electrode portion, the second electrode portion being separately operable from the first electrode portion, wherein, the first electrode portion is symmetric with the second electrode portion;
  a second electrode spaced apart from the first electrode and defining a space between the first electrode and the second electrode;
  a silicon passive membrane layer disposed under the second electrode; and
  a piezoelectric material disposed in the space,
  wherein the first electrode is circular, and the first electrode portion comprises a first semi-circular portion of the electrode and a first semi-annular portion of the electrode and the second electrode portion comprises a second semi-circular portion of the electrode and a second semi-annular portion of the electrode.

2. The transducer of claim 1, wherein the first electrode portion and the second electrode portion are used to correspondingly transmit an ultrasonic wave and to receive a reflected portion of the ultrasonic wave.

3. The transducer of claim 1, wherein the first electrode portion and the second electrode portion being separately addressable comprises the first electrode portion and the second electrode portion may be separately excited or sensed.

4. The transducer of claim 1, wherein the first electrode portion is row addressable as part of a transducer array and the second electrode portion is column addressable as part of the transducer array.

5. The transducer of claim 1, wherein the transducer is piezoelectric micro-machined ultrasonic transducer (pMUT).

6. An array comprising a first transducer in accordance with claim 1 and a second transducer in accordance with claim 1.

7. The array of claim 6, wherein the first transducer comprises a first piezoelectric micro-machined ultrasonic transducer (pMUT) having a first configuration of respective first and second electrodes, and the second transducer is a second pMUT having a second configuration of first and second electrodes, different than the first configuration.

8. The array of claim 7, wherein the first pMUT had a first configuration of the respective first and second electrodes selected from a group of at least five possible configurations of the first and second electrodes and the second pMUT has a second configuration of the first and second electrodes selected from the group of at least five possible configurations of the first and second electrodes, different than the first configuration.

9. The array of claim 7, wherein the first electrodes of the first and second transducers are selectively row addressable and the second electrodes of the first and second transducers are selectively column addressable.

10. The array of claim 7, wherein the first electrodes of the first and second transducers are drivable with a first excitation signal of a first polarity of excitation signals and the second electrodes of the first and the second transducers are drivable with a second excitation signal of equal and opposite polarity to the first excitation signal.

11. The array of claim 7, comprising a two-dimensional beam forming ultrasonic array.

12. An ultrasonic sensing device comprising an array in accordance with claim 7.

* * * * *